United States Patent
Torii et al.

Patent Number: 5,376,627
Date of Patent: Dec. 27, 1994

[54] METHOD OF PREPARING TL-CONTAINING OXIDE SUPERCONDUCTING THIN FILM

[75] Inventors: Yasuko Torii; Katsuya Hasegawa; Hiromi Takei, all of Osaka, Japan

[73] Assignee: Sumitomo Electric Industries, Ltd., Osaka, Japan

[21] Appl. No.: 26,915

[22] Filed: Mar. 5, 1993

[30] Foreign Application Priority Data

Mar. 6, 1992 [JP] Japan .................................. 4-049925
May 14, 1992 [JP] Japan .................................. 4-120924
Jun. 5, 1992 [JP] Japan .................................. 4-145917
Jun. 18, 1992 [JP] Japan .................................. 4-159668

[51] Int. Cl.$^5$ .............................................. B05D 5/12
[52] U.S. Cl. ........................................ 505/473; 505/500; 505/501; 505/730; 505/731; 505/732; 505/742; 427/62; 427/126.3; 427/419.2; 427/419.3; 427/255.7
[58] Field of Search .................... 505/1, 730, 742, 731, 505/732, 473, 500, 501; 427/62, 63, 126.3, 419.2, 419.3, 255.7

[56] References Cited

FOREIGN PATENT DOCUMENTS

0358545 3/1990 European Pat. Off. .
2-64-013 3/1990 Japan .

OTHER PUBLICATIONS

Lee et al, "Low-temperature formation of epitaxial $Tl_2Ca_2Ba_2Cu_3O_{10}$ thin films in reduced $O_2$ pressure", Appl. Phys. Lett. 60(6) Feb. 1992, pp. 772–774.

Subramanyam et al, "Fabrication and Chemical Composition of rf magnetron sputtered Tl-Ca-Ba-Cu-O high Tc superconducting thin films", J. Appl. Phys. 68(3), Aug. 1990, pp. 1157–1163.

Hong et al, "Properties of superconducting $Tl_2Ba_2Ca_2Cu_3O_{10}$ Film by sputtering", Thin Solid Films, 181 (1989) pp. 173–180.

Naziripour et al, "Tl-Ba-Ca-Cu-O superconducting thin films with postdeposition processing using Tl-containing thin films as Tl source", J. Appl. Phys. 70(10), Nov. 1991, pp. 6495–6497.

Liu et al, "Formation of Superconducting $(Tl,Bi)Sr_2CaCu_2O_y$ thin films by rf sputtering and thallium diffusion", Appl. Phys. Lett. 56(21) May 1990, pp. 2135–2137.

*Primary Examiner*—Roy V. King
*Attorney, Agent, or Firm*—Pennie & Edmonds

[57] ABSTRACT

Provided herein is a method of efficiently preparing a thin film having a higher critical temperature as to an oxide superconducting material containing Tl. A thin film of an oxide containing Tl is formed and then heat treated at a temperature of about 850° to 950° C. for a short time, and thereafter further heat treated at a temperature, which is lower than the preceding heat treatment temperature, of at least about 750° C. for a long time. The thin film is heat treated in an atmosphere having an oxygen partial pressure of not more than about 0.1 atm. In formation of a Tl superconducting thin film, on the other hand, a 1212 phase layer is reacted with an amorphous Ca—Cu—O layer to form a 1223 phase layer, or a layer containing volatile metal elements (Tl, Bi and Pb, for example) and oxygen is reacted with another layer containing other elements than the volatile metal elements to form a superconducting film having a high critical temperature.

11 Claims, 4 Drawing Sheets

METHOD OF PREPARING TL-CONTAINING OXIDE SUPERCONDUCTING THIN FILM

BACKGROUND OF THE INVENTION

1. Field of the Invention

The present invention relates to a method of preparing a thin film of an oxide superconductor containing Tl, and more particularly, it relates to a method of preparing a Tl—Bi—Sr—Ca—Cu—O, Tl—Ba—Ca—Cu—O or Tl—Pb—Ba—Ca—Cu—O oxide superconducting thin film.

2. Description of the Background Art

An oxide superconducting thin film is generally prepared by physical vapor deposition such as RF sputtering, ion beam sputtering, laser ablation or electron beam vapor deposition. In such vapor deposition, an oxide crystal of $Al_2O_3$, MgO, $SrTiO_3$, $LaAlO_3$ or $LaGaO_3$ is employed as a substrate. An oxide thin film having a prescribed composition is vapor-deposited on the substrate.

Generally in the Tl-based superconducting thin films, whichever method is employed, the as-grown oxide thin film is in an amorphous phase exhibiting no superconductivity immediately after the vapor deposition. After the vapor deposition, therefore, it is necessary to heat treat the amorphous film at a temperature of about 600° to 950° C., in order to crystallize to superconducting phase. It is effective to heat treat the amorphous thin film under the Tl vapor for the crystallization of Tl—Bi—Sr—Ca—Cu—O, Tl—Ba—Ca—Cu—O or Tl—Pb—Ba—Ca—Cu—O systems. Since there are many superconducting phases having different number of Tl—O or Cu—O layers, however, it is necessary to form the single superconducting phase.

In the Tl—Bi—Sr—Ca—Cu—O system, a superconducting phase having the highest critical temperature is expressed in a composition formula of $(Tl, Bi)Sr_2Ca_2Cu_3O_x$ (1223 phase), and its critical temperature is about 120 K. In addition, there exists a superconducting phase having a lower critical temperature, which can be expressed in a composition formula of $(Tl, Bi)Sr_2CaCu_2O_x$ (1212 phase). When a heat treatment is performed in accordance with the conventional method to obtain a thin film of the 1223 phase in this system, however, the 1212 phase is preferentially formed in general. According to the conventional method, no 1223 phase is formed unless the heat treatment is performed at a high temperature of about 900° C. However, the heat treatment under such a high temperature is followed by aggregation of the structure and formation of impurities, leading to extreme reduction in volume rate of the as-formed 1223 phase. Further, the high-temperature heat treatment also leads to decomposition, resulting in deposition of a granular Ca—Cu—O phase. Once such a granular phase is formed, this phase remains so stable that formation of the 1223 phase is inhibited. In addition, the high-temperature heat treatment leads to dissociation of Tl.

In the Tl—Ba—Ca—Cu—O system, on the other hand, superconducting phase having the highest critical temperature is expressed in a composition formula of $Tl_2Ba_2Ca_2Cu_3O_x$ (2223 phase), and its critical temperature is about 125 K. In addition, there exist a number of superconducting phases having lower critical temperatures, which can be expressed in composition formulas of $Tl_2Ba_2CaCu_2O_x$ (2212 phase), $T_2Ba_2Ca_2Cu_3O_x$ (1223 phase) and $TlBa_2Ca_3Cu_4O_x$ (1234 phase). When a heat treatment is performed in accordance with the conventional method to form the 2223 phase in this system, however, the 2212 phase is preferentially formed in general and formation the 2223 phase is suppressed. In general, therefore, it is difficult to form the 2223 phase having the highest critical temperature at a high volume rate. When the neat treatment is performed at a high temperature to form the 2223 phase, it leads to the aforementioned problems of separation of a Ca—Cu—O phase and dissociation of Tl.

In the Tl—Pb—Ba—Ca—Cu—O system, further, a superconducting phase having the highest critical temperature is expressed in a composition formula of $(Tl,Pb)Ba_2Ca_2Cu_3O_x$ (1223 phase), and its critical temperature is about 120 K. In addition, there exists a superconducting phase having a lower critical temperature, which can be expressed in a composition formula of $(Tl, Pb)Sr_2CaCu_2O_x$ (1212 phase). When a heat treatment is performed in accordance with the conventional method to form the 1223 phase in this system, however, the 1212 phase is preferentially formed in general. Also in this system, therefore, it is difficult to form the 1223 phase at a high volume rate by the conventional method. When the heat treatment is performed under a high temperature, further, it also leads to the aforementioned problems of separation of a Ca—Cu—O phase and dissociation of Tl.

SUMMARY OF THE INVENTION

An object of the present invention is to provide a process which can efficiently prepare a superconducting thin film which contains a superconducting phase having a higher critical temperature at a high volume rate, in preparation of a thin film of a superconductor containing Tl.

The present invention provides a method of preparing a thin film which is mainly composed of an oxide superconductor having a critical temperature of at least about 100 K from one or more thin films containing elements capable of forming a Tl oxide superconductor.

According to an aspect of the present invention provided is a method of separating a heat treatment for forming a superconducting phase into two stages. According to this method, an amorphous thin film consisting essentially of elements capable of forming a Tl oxide superconductor is formed on a substrate first. Then, the amorphous thin film is heat treated with a Tl vapor source at a first temperature of about 850° to 950° C. for a first time period. Then, the thin film, which is heat treated at the first temperature for the first time period, is heat treated with the Tl vapor source at a second temperature, which is lower than the first temperature, of at least about 750° C. for a second time period which is longer than the first time. According to this method, the first time period is preferably not more than about 1 hour, and a time of about 10 to 30 minutes is preferably employed, for example. On the other hand, the second time period is preferably at least about 1 hour, and a time of about 2 to 8 hours is preferably employed, for example.

According to another aspect of the present invention, provided is a method of limiting an oxygen partial pressure in an atmosphere for performing a heat treatment for forming a superconducting phase. According to this method, an amorphous thin film consisting essentially of elements capable of forming a Tl oxide superconductor is formed on a substrate first. Then, the amorphous thin film is heat treated with a Tl vapor source under an atmosphere having a partial pressure of gaseous oxygen of not more than about 0.1 atm. According to this method, the atmosphere having a partial pressure of gaseous oxygen of not more than about 0.1 atm. is preferably prepared from that containing inert gas and gaseous oxygen with a gaseous oxygen partial pressure of not more than about 0.1 atm., for example.

According to still another aspect of the present invention, provided is a method of controlling the composition and thickness of a film which is formed before a heat treatment. According to this method, an amorphous film having a composition of $Tl_aBi_bSr_cCa_dCa_3O_x$ ($0.7 \leq a \leq 3.0, 0.2 \leq b \leq 1.0, 1.6 \leq c \leq 2.4, 1.6 \leq d \leq 2.4$) is formed on a substrate in a thickness of at least about 0.2 μm and not more than about 1.8 μm. Then, the as-formed amorphous film is heat treated with a Tl vapor source at a temperature of about 850° to 940° C. for about 5 minutes to about 8 hours. The process comprising such steps is preferably applied to preparation of a superconducting thin film having one layer of a (Tl, Bi)—O phase, two layers of SrO planes, two layers of Ca planes and three layers of $Cu-O_2$ planes and a c-axis which is substantially perpendicular to the substrate in a unit cell of the superconducting phase.

According to a further aspect of the present invention, provided is a method of forming a superconducting phase having a high critical temperature by reacting a superconducting phase having a low critical temperature with an amorphous Ca—Cu—O phase. According to this method, a first layer which is mainly composed of a Tl oxide superconductor having a first critical temperature is formed first. Then, an amorphous second layer consisting essentially of Ca, Cu and O is formed on the first layer. Thereafter the layers are heat treated with a Tl vapor source so that the first layer is reacted with the second layer, thereby forming a thin film mainly composed of a Tl oxide superconductor having a second critical temperature which is higher than the first critical temperature. According to this method, it is preferable that composition ratios of elements in the total quantity of the elements forming the first and second layers are substantially equal to stoichiometric composition ratios in the Tl oxide superconductor having the second critical temperature. The second critical temperature can be in excess of about 110 K in this method.

According to a further aspect of the present invention, provided is a method of forming a Tl oxide superconductor film having a high critical temperature by reacting an oxide layer containing no volatile metal elements such as Tl, Bi and Pb and another oxide layer consisting essentially of volatile metal elements and oxygen. According to this method, a first layer consisting essentially of elements, excluding volatile metal elements from the elements capable of forming a Tl oxide superconductor, is formed on a substrate first. Then, a second layer consisting essentially of the volatile metal elements excluded in the preceding step and oxygen is formed on the first layer. Then, the layers are heat treated with a Tl vapor source so that the first layer is reacted with the second layer, thereby forming a thin film which is mainly composed of a Tl oxide superconductor having a critical temperature of at least about 100 K. According to this method, it is preferable that composition ratios of elements in the total quantity of the elements forming the first and second layers are substantially equal to stoichiometric composition ratios in the Tl oxide superconductor formed by the reaction. According to this method, it is possible to form an oxide superconductor having a critical temperature of at least about 110 K by the reaction.

The foregoing and other objects, features, aspects and advantages of the present invention will become more apparent from the following detailed description of the present invention when taken in conjunction with the accompanying drawings.

DETAILED DESCRIPTION OF THE INVENTION

Figure 1A:
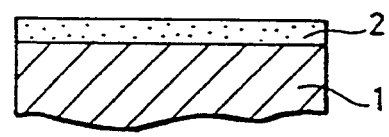
FIGS. 1A, 1B and 1C are sectional views showing steps of preparing a (Tl, Bi)$Sr_2Ca_2Cu_3O_x$ superconducting thin film in Example IX according to the present invention.

In the inventive method of separating a heat treatment into two stages, it is possible to form nuclei of a target superconducting phase having a high critical temperature by heating a thin film of an oxide containing Tl at a first temperature of about 850° to 950° C. for a short time. It is also possible to grow the superconducting phase formed as nuclei by thereafter heat treating the same at a second temperature, which is lower than the first temperature, of at least about 750° C. for a long time. Thus, it is possible to selectively generate nuclei of a superconducting phase having a high critical temperature first and then reliably grow the same by separating the heat treatment into two stages of a high-temperature short-time treatment and a low-temperature long-time treatment. As described later with reference to Example, nuclei of a target superconducting phase having a high critical temperature can be preferentially formed in the first stage heat treatment at a temperature of about 850° to 950° C. If the heat treatment temperature is higher than about 950° C. or lower than about 850° C., a superconducting phase having a low critical temperature and non-superconducting phases are preferentially formed, as understood from Example. On the other hand, a temperature for the second stage heat treatment must be lower than that in the first stage and in excess or about 750° C. If this heat treatment is performed at a temperature higher than that in the first stage, a superconducting phase having a low critical temperature and non-superconducting phases are formed as understood from Example. If the second stage heat treatment is performed at a temperature lower than about 750° C., further, a superconducting phase having a low critical temperature is formed as understood from Example. When the heat treatment is continuously performed at the high temperature employed in the first stage, the structure of the superconductor is remarkably aggregated. When the first stage heat treatment is completed in a short time and the second stage heat treatment is then performed at a temperature lower than that in the first stage, on the other hand, it is possible to facilitate only growth of the superconducting phase, thereby forming an extremely dense and homogeneous superconductor structure.

In the inventive method of reducing a partial pressure of gaseous oxygen to not more than about 0.1 arm., it is possible to selectively form a superconducting phase having a high critical temperature by limiting the partial pressure of gaseous oxygen. In the Tl—Ba—Ca—Cu—O and Tl—Bi—Sr—Ca—Cu—O systems, for example, 2223 and 1223 phases having high critical temperatures are so stable when Cu valences in the structures are small that the same are easily formed under non-oxidizing atmospheres having lower partial pressures of gaseous oxygen. However, when oxygen partial pressures are in excess of about 0.1 atm. for example, 2212 and 1212 phases having low critical temperatures are so preferentially formed in the respective systems that superconducting thin films having high critical temperatures cannot be obtained, as shown in Example described below.

In the inventive method of controlling the composition and thickness of a film before a heat treatment for forming a Tl—Bi—Sr—Ca—Cu—O film, it is necessary to control the contents of Tl, Bi, Sr, Ca and Cu in composition ratios of a:b:c:d:3 with a in a range of about 0.7 to 3.0, b in a range of about 0.2 to 1.0, c in a range of about 1.6 to 2.4 and d in a range of about 1.6 to 2.4 as to the composition of the as-formed amorphous film. More preferably, a is in a range of about 1.2 to 2.5,b is in a range of about 0.2 to 0.7,c is in a range of about 1.6 to 2.4 and d is in a range of about 1.6 to 2.4. The composition ratio of O can be arbitrarily selected. Further, the composition ratios of St, Ca and Cu are preferably approximate to stoichiometric composition ratios for forming a 1223 phase. As to Tl and Bi having higher vapor pressures as compared with the aforementioned three elements, on the other hand, it is necessary to consider composition fluctuation in the subsequent heat treatment. It is possible to form an amorphous film having such composition ratios by sputtering, MBE or multi-element vapor deposition. Further, it is preferable to multi-elementally form the amorphous film by simultaneously depositing the respective elements on a substrate, so that the respective elements can be homogeneously distributed in the directions of depth and surfaces in a three-dimensional manner. A film on which the respective elements are deposited in such a manner can be easily brought into a superconducting phase by the subsequent heat treatment. It is possible to control the composition ratios of the film by adjusting the rates or times for supplying the respective elements, for example. The as-formed amorphous film can be preferably at least about 0.2 $\mu$m and not more than about 1.8 $\mu$m in thickness. If the thickness of the film is less than about 0.2 $\mu$m the structure of the superconducting phase can be so extremely aggregated in the subsequent heat treatment that non-superconducting phases can be formed at high volume rates. If the thickness of the film is in excess of about 1.8 $\mu$m, on the other hand, the structure of the superconducting phase can be made so bulky that a rough film surface can be obtained. A substrate to be provided with the amorphous film preferably has small reactivity with Tl—Bi—Sr—Ca—Cu so that the substrate elements and the film elements will not diffuse with each other in the interface between the substrate and the amorphous film. Such a substrate is preferably prepared from LaAlO$_3$ or MgO. According to this method, the amorphous film is heat treated at a temperature of about 850° to 940° C. for about 5 minutes to about 8 hours, preferably at a temperature of about 880° to 940° C. and for about 5 minutes to about 2 hours. According to such heat treatment, it is possible to obtain a superconducting thin film containing a 1223 phase which is formed at a high volume rate in an oxide superconductor. In this heat treatment, the temperature of about 850° C. is the minimum level required for crystallization. If the heat treatment is performed at a temperature exceeding about 940° C., on the other hand, the superconducting phase can be remarkably decomposed. Further, a homogeneous superconducting phase cannot be obtained if the heat treatment time is shorter than about 5 minutes, while composition displacement can be remarkably caused if the heat treatment time is in excess of about 8 hours. In the aforementioned temperature and time ranges, the heat treatment under a high temperature is preferably performed for a short time in order to prevent aggregation of the structure and formation of impurities, while that under a low temperature is preferably performed for a longer time than that in the high-temperature treatment in order to sufficiently grow the superconducting phase.

Further, the amorphous film is preferably heat treated with a Tl vapor source. The Tl vapor source which is adapted to supply a Tl vapor pressure at the heat treatment temperature, can be preferably formed by a Tl—Bi—Sr—Ca—Cu—O sintering material, for example. It is possible to suppress evaporation of Tl from the film and prevent composition displacement of the film by supplying the Tl vapor pressure during the heat treatment. Such a Tl—Bi—Sr—Ca—Cu—O sintering material can also supply a vapor pressure to elements other than Tl, particularly Bi, whereby it is possible to also suppress evaporation of the elements other than Tl from the film and effectively prevent composition displacement.

The inventive method including a step of reacting a superconducting layer having a low critical temperature with an amorphous Ca—Cu—O layer can be carried out through the following process, for example:

In preparation of a Tl—Bi—Sr—Ca—Cu—O superconducting thin film, a (Tl, Bi)Sr$_2$CaCu$_2$0$_x$ layer is formed on a substrate first. Then, an amorphous Ca—Cu—O layer is formed on this layer. Then, a heat treatment is performed to react the lower (Tl, Bi)Sr$_2$CaCu$_2$O$_x$ layer with the upper amorphous Ca—Cu—O layer, thereby synthesizing a (Tl, Bi)Sr$_2$Ca$_2$Cu$_3$O$_x$ layer.

In preparation of a Tl—Ba—Ca—Cu—O superconducting thin film, on the other hand, a Tl$_2$Ba$_2$CaCu$_2$O$_x$ layer is formed on a substrate first. Then an amorphous Ca—Cu—O layer is formed on this layer. Thereafter a heat treatment is performed to react the lower Tl$_2$Ba$_2$CaCu$_2$O$_x$ layer with the upper amorphous Ca—Cu—O layer, thereby synthesizing a Tl$_2$Ba$_2$Ca$_2$Cu$_3$0$_x$ superconducting thin film.

In preparation of a Tl—Pb—Ba—Ca—Cu—O superconducting thin film, further, a (Tl, Pb)Ba$_2$CaCu$_2$O$_x$ layer is formed on a substrate first. Then, an amorphous Ca—Cu—O layer is formed on this layer. Thereafter a heat treatment is performed to react the lower (Tl, Pb)Ba$_2$CaCu$_2$O$_x$ layer with the upper amorphous Ca—Cu—O layer, thereby synthesizing a (Tl, Pb)Ba$_2$Ca$_2$Cu$_3$O$_x$ superconducting thin film.

In this method, the step of forming the (Tl,Bi)Sr$_2$CaCu$_2$O$_x$ layer, the Tl$_2$Ba$_2$CaCu$_2$O$_x$ layer or the (Tl,Pb)Ba$_2$CaCu$_2$O$_x$ layer and the step of forming the amorphous Ca—Cu—O layer on this layer may be alternately repeated a plurality of times.

According to this method, it is possible to efficiently form a (Tl,Bi)Sr$_2$Ca$_2$Cu$_3$O$_x$ layer, a Tl$_2$Ba$_2$Ca$_2$Cu$_3$O$_x$ layer or a (Tl,Pb)Ba$_2$Ca$_2$Cu$_3$O$_x$ layer by easily reacting the amorphous Ca—Cu—O layer with the (Tl,Bi)Sr$_2$CaCu$_2$O$_x$ layer, the Tl$_2$Ba$_2$CaCu$_2$O$_x$ layer or the (Tl,Pb)Ba$_2$CaCu$_2$O$_x$ layer. Further, the lower layer, i.e., the (Tl,Bi)Sr$_2$CaCu$_2$O$_x$ layer, the Tl$_2$Ba$_2$CaCu$_2$O$_x$ layer or the (Tl,Pb)Ba$_2$CaCu$_2$O$_x$ layer is easily c-axis oriented on the substrate. It is possible to synthesize an easily c-axis oriented (Tl,Bi)Sr$_2$Ca$_2$Cu$_3$O$_x$, Tl$_2$Ba$_2$Ca$_2$Cu$_3$O$_x$ or (Tl,Pb)Ba$_2$Ca$_2$Cu$_3$O$_x$ layer having excellent crystallinity by reacting such an easily c-axis oriented lower layer with the amorphous Ca—Cu—O layer.

The inventive method including a step of reacting an oxide layer containing no volatile metal elements with another oxide layer of volatile metal elements can be carried out through the following process, for example:

In preparation of a Tl—Bi—Sr—Ca—Cu—O superconducting thin film, an Sr—Ca—Cu—O thin film is formed on a substrate first. Then, a Tl—Bi—O thin film is formed on this thin film. Thereafter a heat treatment is performed to react the lower Sr—Ca—Cu—O thin film with the upper Tl—Bi—O thin film, thereby synthesizing a Tl—Bi—Sr—Ca—Cu—O superconducting thin film.

In preparation of a Tl—Ba—Ca—Cu—O superconducting thin film, on the other hand, a Ba—Ca—Cu—O thin film is formed on a substrate first. Then, a Tl—O thin film is formed on this thin film. Thereafter a heat treatment is performed to react the lower Ba—Ca—Cu—O thin film with the upper Tl—0 thin film, thereby synthesizing a Tl—Ba—Ca—Cu—O superconducting thin film.

In preparation of a Tl—Pb—Ba—Ca—Cu—O superconducting thin film, further, a Ba—Ca—Cu—O thin film is formed on a substrate first. Then, a Tl—Pb—O thin film is formed on this thin film. Thereafter a heat treatment is performed to react the lower Ba—Ca—Cu—O thin film with the upper Tl—O thin film, thereby synthesizing a Tl—Pb—Ba—Ca—Cu—O superconducting thin film.

In this method, the steps of forming the upper and lower layers may be alternately repeated a plurality of times.

According to this method, a simplified reaction path of reacting upper and lower layers is employed in order to prepare a Tl—Bi—Sr—Ca—Cu—O, Tl—Ba—Ca—Cu—O or Tl—Pb—Ba—Ca—Cu—O superconducting thin film. In preparation of the lower Sr—Ca—Cu—O or Ba—Ca—Cu—O layer, it is possible to increase the substrate temperature to prepare a thin film having this composition, since this layer contains no Tl. A Tl—Bi—O layer can be easily diffused in an Sr—Ca—Cu—O layer while Tl—O and Tl—Pb—O layers can be easily diffused in Ba—Ca—Cu—O layers, to efficiently progress the reaction. It is possible to form a superconducting phase having a high critical temperature by such reaction. EXAMPLE In Examples I and II, the process of performing a heat treatment in two stages were studied. Example I (Tl—Bi—Sr—Ca—Cu—O System)

MgO substrates were employed to form amorphous thin films of Tl—Bi—Sr—Ca—Cu—O systems thereon by RF sputtering.

Then, (Tl,Bi)Sr$_2$Ca$_2$Cu$_3$O$_x$ sintering samples were employed as Tl vapor sources, and the substrates provided with the amorphous thin films and these sintering samples were filled in gold pipes to be subjected to two-stage heat treatments under conditions shown in Table 1.

TABLE 1

| No. | Conditios for First-Stage Heat Treatment | Conditions for Second-Stage Heat Treatment | As-Formed Phase | Cirtical Temperature $T_{ci}$ $T_{co}$ (K) |
|---|---|---|---|---|
| 1 | 900° C. × 10 min. | 850° C. × 2 h. | 1223 >> 1212 | 100, 120 |
| 2 | 900° C. × 10 min. | 820° C. × 8 h. | 1223 >> 1212 | 108, 120 |
| 3 | 850° C. × 20 min. | 800° C. × 4 h. | 1223 >> 1212 | 102, 119 |
| 4 | 920° C. × 10 min. | 780° C. × 4 h. | 1223 >> 1212 | 100, 120 |
| 5 | 900° C. × 10 min. | 700° C. × 4 h. | 1223 << 1212 | 80, 100 |
| 6 | 800° C. × 30 min. | 880° C. × 4 h. | 1212, 1201, Non-Superconducting Phase — | 55, 95 |
| 7 | 980° C. × 10 min. | 800° C. × 4 h. | 1212, 1201, Non-Superconducting Phase | —, 90 |
| 8 | 860° C. × 10 min. | 880° C. × 4 h. | 1212, 1201, Non-Superconducting Phase | 60, 85 |

Note:
$T_{ci}$: zero resistance temperature
$T_{co}$: onset temperature

Referring to Table 1, Nos. 1 to 4 are inventive samples and Nos. 5 to 8 are comparative samples which were heat treated under conditions out of the ranges of the present invention.

Table 1 also shows states of phases formed after the heat treatments and critical temperatures of the thin films. Referring to Table 1, (Tl,Bi)Sr$_2$CuO$_x$ layers are expressed as 1201.

As understood from Table 1, 1223 phases having high critical temperatures were preferentially formed when the samples were heat treated at temperatures of about 850° to 950° C. for about 10 to 20 minutes in the first stages, while 1212 and 1201 phases having low critical temperatures and non-superconducting phases were formed when the temperatures in the first stages were higher than about 950° C. (No. 7) and lower than about 850° C. (No. 6). Further, the amount of a 1212 phase was larger than that of a 1223 phase when the heat treatment temperature in the second stage was lower than about 750° C. (No. 5), while 1212 and 1201 phases having low critical temperatures and non-superconducting phases were formed when temperatures of the second stages were higher than those in the first stages (Nos. 6 and 8). As understood from Example I, it was possible to form a thin film of a 1223 phase having a high critical temperature by combining a high-temperature short-time heat treatment and a low-temperature long-time heat treatment in the Tl—Bi—Sr—Ca—Cu—O system. Example II (Tl—Ba—Ca—Cu—O System)

Amorphous thin films of Tl—Ba—Ca—Cu—O systems were prepared by RF sputtering on substrates of MgO.

Then, $Tl_2Ba_2Ca_2Cu_3O_x$ sintering samples were employed as Tl vapor sources, and the substrates provided with the thin films and these sintering samples were filled in gold pipes, to be subjected to two-stage heat treatments respectively under conditions shown in Table 2.

TABLE 2

| No. | Conditios for First-Stage Heat Treatment | Conditions for Second-Stage Heat Treatment | As-Formed Phase | Cirtical Temperature $T_{ci} T_{co}$ (K) |
|---|---|---|---|---|
| 1 | 880° C. × 10 min. | 840° C. × 4 h. | 2223 >> 2212 | 120, 125 |
| 2 | 920° C. × 10 min. | 800° C. × 4 h. | 2223 >> 2212 | 118, 124 |
| 3 | 900° C. × 10 min. | 860° C. × 4 h. | 2223 >> 2212 | 115, 125 |
| 4 | 820° C. × 10 min. | 800° C. × 4 h. | 2212 >> 2223 | 108, 115 |
| 5 | 960° C. × 10 min. | 800° C. × 4 h. | 2212, 1223, Non-Superconducting Phase | 80, 110 |
| 6 | 860° C. × 10 min. | 880° C. × 4 h. | 2212, 1223, Non-Superconducting Phase | 95, 118 |

Note:
$T_{ci}$: zero resistance temperature
$T_{co}$: onset temperature

Referring to Table 2, Nos. 1 to 3 are inventive samples, and Nos. 4 to 6 are comparative samples which were heat treated under conditions out of the ranges of the present invention. Table 2 also shows states of phases formed after the heat treatments and critical temperatures of the as-formed thin films.

As understood from Table 2, 2223 phases having high critical temperatures were preferentially formed when the samples were heat treated in the first stages at temperatures of about 850° to 950° C., which were higher than those in the second stages, for about 10 minutes. On the other hand, a 2212 phase having a low critical temperature was preferentially formed when the temperature in the first stage was lower than about 850° C. (No. 4). When the temperature in the first stage was higher than about 950° C (No. 5), 2212 and 1223 phases and non-superconducting phases were formed and the as-obtained thin film exhibited a low critical temperature. Also when the temperature in the second stage was higher than that in the first stage (No. 6), 2212 and 1223 phases and non-superconducting phases were preferentially formed. As understood from Example II, it was possible to preferentially form a thin film of a 2223 phase having a high critical temperature by combining a high-temperature short-time heat treatment and a low-temperature long-time heat treatment in the Tl—Ba—Ca—Cu—O system.

In Examples III and IV, atmospheres in heat treatments, particularly oxygen partial pressures were studied.

Example III (Tl—Bi—Sr—Ca—Cu—O System)

Amorphous thin films of Tl—Bi—Sr—Ca—Cu—O systems were prepared by multi-element vapor deposition on substrates of MgO, which were set at the room temperature.

$(Tl,Bi)Sr_2Ca_2Cu_3O_x$ sintering samples were employed as Tl vapor sources, and the substrates provided with the vapor-deposited thin films and these sintering samples were inserted in gold pipes. Then atmospheres of argon or argon and oxygen were introduced into the gold pipes, which in turn were melt-sealed and heat treated at about 860° C. for about 30 minutes. Table 3 shows seven types of atmospheres employed for performing the heat treatments at about 860° C. for about 30 minutes.

TABLE 3

| No. | $O_2$ Partial Pressure in $O_2$ + Ar Atmosphere (atm.) | Critical Temperature (K) | |
|---|---|---|---|
| | | $T_{ci}$ | $T_{co}$ |
| 1 | 0.1 | 112 | 116 |
| 2 | 0.05 | 110 | 120 |
| 3 | 0.02 | 114 | 119 |
| 4 | 0.005 | 113 | 117 |
| 5 | 0 | 110 | 118 |
| 6 | 0.15 | 80 | 118 |
| 7 | 0.20 | 72 | 89 |

Table 3 shows values of oxygen partial pressures in atmospheres of about 1 atm. Referring to Table 3, Nos. 1 to 5 are inventive samples and Nos. 6 and 7 are comparative samples which were obtained under atmospheres having oxygen partial pressures exceeding about 0.1 atm. Table 3 also shows superconducting properties of thin films obtained after the heat treatments. Referring to Table 3, Tci represents temperatures at which the samples lost electrical resistance, and Tco represents onset temperatures.

As understood from Table 3, it was possible to obtain a thin film having a high critical temperature by performing a heat treatment under an atmosphere having an oxygen partial pressure of not more than about 0.1 atm. When the oxygen partial pressure was in excess about 0.1 atm., the critical temperature was remarkably reduced. Further, it was confirmed by X-ray diffraction that all thin films prepared in the inventive samples Nos. 1 to 5 were mainly composed of c-axis oriented 1223 phases.

Example IV (Tl—Ba—Ca—Cu—O System)

Thin films of Tl—Ba—Ca—Cu—O systems were prepared by multi-element vapor deposition. Substrates of MgO were employed and temperatures thereof were set at the room temperature.

$Tl_2Ba_2Ca_2Cu_3O_x$ sintering samples were employed as Tl vapor sources, and the substrates provided with the vapor-deposited thin films and these sintering samples were inserted in gold pipes. Then, atmospheres of argon or argon and oxygen were introduced into the gold pipes, which in turn were melt-sealed and heat treated at about 860° C. for about 30 minutes.

Table 4 shows seven types of atmospheres employed for performing the heat treatments in the gold pipes.

TABLE 4

| No. | $O_2$ Partial Pressure in $O_2$ + Ar Atmosphere (atm.) | Critical Temperature (K) $T_{ci}$ | $T_{co}$ |
|---|---|---|---|
| 1 | 0.1 | 116 | 120 |
| 2 | 0.05 | 117 | 123 |
| 3 | 0.02 | 118 | 124 |
| 4 | 0.005 | 114 | 120 |
| 5 | 0 | 116 | 122 |
| 6 | 0.15 | 85 | 115 |
| 7 | 0.20 | 88 | 110 |

Table 4 shows values oxygen partial pressures contained in the heat treatment atmospheres of about 1 atm. Referring to Table 4, Nos. 1 to 5 are inventive samples, and Nos. 6 and 7 are comparative samples which were heat treated in atmospheres having oxygen partial pressures exceeding about 0.1 atm. Table 4 also shows superconducting properties of thin films obtained after the heat treatments. Tci and Tco represent the aforementioned temperatures.

As understood from Table 4, it was possible to obtain a thin film having a high critical temperature by performing a heat treatment in an atmosphere having an oxygen partial pressure of not more than about 0.1 atm. When the oxygen partial pressure was excess of about 0.1 atm., the critical temperature was remarkably reduced.

As shown in Example IV, it is possible to obtain a thin film which is mainly composed of a c-axis oriented 2223 phase having a high critical temperature by forming a thin film and heat treating the same in an atmosphere having an oxygen partial pressure of not more than about 0.1 atm.

In Examples V to VIII, compositions and thicknesses of Tl—Bi—Sr—Ca—Cu—O films formed at first, types of substrates to be provided with the films, and atmospheres for performing heat treatments were studied.

Example V

Substrates of MgO single crystals were employed to form amorphous thin films of Tl—Bi—Sr—Ca—Cu—O systems thereon by multi-element vapor deposition in various compositions shown in Table 5. The as-formed thin films were about 0.8 μm in thickness.

TABLE 5

| No. | Tl | Bi | Sr | Ca | Cu |
|---|---|---|---|---|---|
| 1 | 0.7 | 0.4 | | | |
| 2 | 1.2 | 0.4 | | | |
| 3 | 1.6 | 0.4 | | | |
| 4 | 2.0 | 0.5 | | | |
| 5 | 2.0 | 0.2 | 2.0 | 2.0 | 3.0 |
| 6 | 2.0 | 0.8 | | | |
| 7 | 2.4 | 0.4 | | | |
| 8 | 2.4 | 0.6 | | | |
| 9 | 2.8 | 0.5 | | | |
| 10 | 2.8 | 1.0 | | | |
| 11 | 3.2 | 0.4 | | | |
| 12 | 1.6 | 0.1 | | | |
| 13 | 2.0 | 1.2 | | | |

Then, the thin films were heat treated under conditions shown in Table 6, for crystallization of the amorphous films.

TABLE 6

| No. | Heat Treatment Condition Temperature × Time |
|---|---|
| A | 940° C. × 5 min. |
| B | 920° C. × 20 min. |
| C | 900° C. × 30 min. |
| D | 880° C. × 2 h. |
| E | 850° C. × 8 h. |
| F | 950° C. × 5 min. |
| G | 940° C. × 2 min. |
| H | 940° C. × 10 h. |
| I | 880° C. × 10 h. |
| J | 840° C. × 8 h. |
| K | 800° C. × 20 h. |

143 types of heat treatments (13 compositions by 11 heat treatment conditions) were performed with Tl—Bi—Sr—Ca—Cu—O sintering samples serving as Tl vapor sources. In the 143 types of heat treatments, the substrates provided with the amorphous films were filled in Au capsules with the Tl vapor sources.

143 films obtained by the heat treatments were subjected to evaluation of superconducting properties by XRD patterns and measurement of electrical resistance. As the result, Tl—Bi—Sr—Ca—Cu—O superconducting phases having c-axes which were perpendicular to the substrates were formed with 1223 phases occupying at least about 60% only in combinations of Nos. 1 to 10 in Table 5 and Nos. A to E in Table 6. All thin films obtained in such combinations exhibited critical temperatures of at least about 100 K. Particularly in the combinations of Nos. 2 to 5, 7 and 8 in Table 5 and Nos. A to D in Table 6, the 1223 phases occupied at least about 80% and the thin films exhibited critical temperatures of at least about 108 K. The rates of the 1223 phases were estimated from the XRD patterns.

Example VI

Substrates of MgO, $LaAlO_3$ and $SrTiO_3$ were employed to form amorphous films of oxide superconductors thereon by multi-element vapor deposition at the room temperature. The as-formed films contained Tl, Bi, Sr, Ca and Cu in composition ratios of 2.0:0.5:2:2:3, and had thicknesses of about 0.8 μm.

Then, heat treatments were performed under conditions of about 920° C. by about 20 minutes, in order to crystallize the amorphous films. Similarly to Example V, Tl—Bi—Sr—Ca—Cu—O sintering samples were employed as Tl vapor sources to perform the heat treatments in sealed Au capsules. Table 7 shows critical temperatures of the thin films obtained after the heat treatments.

TABLE 7

| Substrate | MgO | LaAlO3 | SrTiO3 |
| --- | --- | --- | --- |
| Critical Temperature | 110K | 112K | 86K |

It is understood from Table 7 that thin films exhibiting critical temperatures of at least about 100 K were obtained when the MgO and LaAlO3 substrates were employed.

Example VII

Substrates of MgO single crystals were obtained to form amorphous films of Tl—Bi—Sr—Ca—Cu—O systems thereon by multi-element vapor deposition at the room temperature. The as-formed films contained Tl, Bi, Sr, Ca and Cu in composition ratios of 2.0:0.5:2:2:3.

On the other hand, the films were about 0.1 μm, about 0.2 μm, about 0.4 μm, about 0.8 μm, about 1.2 μm, about 1.6 μm, about 1.8 μm and about 2.0 μm in thickness. Each of the amorphous films having such eight types of thicknesses was subjected to heat treatments of at about 940° C. for about 10 minutes, at about 920° C. for about 10 minutes, at about 900° C. for about 10 minutes and at about 880° C. for 10 minutes respectively. Tl—Bi—Sr—Ca—Cu—O sintering samples were employed as Tl vapor sources, and the substrates were filled in Au capsules with the Tl vapor sources to be subjected to the heat treatments.

Table 8 shows critical temperatures of the as-obtained thin films. Referring to Table 8, conditions providing thin films having critical temperatures of at least about 100 K are shown with circles, while those providing thin films having critical temperatures of at least about 108 K are shown with double circles. Under the double-circled conditions, 1223 phases with c-axes perpendicular to the substrates occupied at least about 80% in all samples.

TABLE 8

| Film Thickness | 940° C. × 10 min. | 920° C. × 10 min. | 900° C. × 10 min. | 880° C. × 10 min. |
| --- | --- | --- | --- | --- |
| 0.1 μm | | | | |
| 0.2 μm | | | | |
| 0.4 μm | | | ○ | ○ |
| 0.8 μm | ⊙ | ⊙ | ○ | ○ |
| 1.2 μm | ⊙ | ⊙ | ○ | |
| 1.6 μm | ⊙ | ○ | | |
| 1.8 μm | ○ | ○ | | |
| 2.0 μm | | | | |

Example VIII

Substrates of MgO single crystals were employed to form amorphous films of oxide superconductors thereon by multi-element vapor deposition at the room temperature. The as-formed films contained Tl, Bi, Sr, Ca and Cu in composition ratios of 2.0:0.5:2:2:3, and had thicknesses of about 0.8 μm.

Then, heat treatments were performed under conditions of at about 920° C. for about 20 minutes in order to crystallize the amorphous films, in the following three manners:

(1) A Tl—Bi—Sr—Ca—Cu—O sintering material was employed as a Tl vapor source to perform the heat treatment in a sealed Au capsule.

(2) No Tl vapor source was employed to perform the heat treatment in a sealed Au capsule.

(3) Tl2O3 powder was employed as a Tl vapor source to perform the heat treatment in a sealed Au capsule.

As the result, a thin film exhibiting a critical temperature of at least about 100 K. was obtained only in (1), while films obtained in (2) and (3) exhibited no superconducting properties.

In each of Examples IX to XIV, a process of stacking two types of films having different compositions and reacting the same with each other was studied.

Example IX (Tl—Bi—Sr—Ca—Cu—O System)

First, a Tl—Bi—Sr—Ca—Cu—O layer was formed on an MgO (100) single-crystalline substrate by multi-element vapor deposition. In such vapor deposition, the substrate was set at the room temperature with an oxygen partial pressure of $1 \times 10^{-5}$ Torr, while Tl, Bi2O3, Sr, Ca and Cu were employed as vapor deposition raw materials. The rates or times for vapor-depositing the respective raw materials were adjusted to control the film composition to $(Tl,Bi)Sr_2CaCu_2O_x$. Then, the substrate provided with the film was filled in a gold pipe with a Tl source, so that the film was heat treated in Tl vapor. The Tl source was formed by a sintering material having a composition of $(Tl,Bi)Sr_2CaCu_2O_x$. The heat treatment was performed at a temperature of about 800° C. for about 15 minutes. FIG. 1A shows the result of this step. As shown in FIG. 1A, a $(Tl,Bi)Sr_2CaCu_2O_x$ layer 2 was formed on a substrate 1.

Figure 1B:
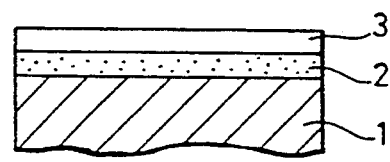

Then, a Ca—Cu—O layer was formed on this layer. Ca and Cu were employed as vapor deposition raw materials to form the film by multi-element vapor deposition. In such vapor deposition the substrate was set at the room temperature, with an oxygen partial pressure of $1 \times 10^{-5}$ Torr. The amounts of Ca and Cu were so adjusted that the elements totalized in the two layers provided on the substrate formed a composition of $(Tl,Bi)Sr_2Ca_2Cu_3O_x$. FIG. 1B shows the result of this step. As shown in FIG. 1B an amorphous Ca—Cu—O layer 3 was formed on the $(Tl,Bi)Sr_2CaCu_2O_x$ layer 2 which was provided on the substrate 1.

Figure 1C:
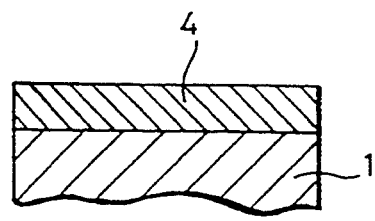

Then, the substrate provided with the two layers were filled in a gold pipe with a Tl source, and subjected to a heat treatment in Tl vapor. The Tl source was formed by a sintering material having a composition of $(Tl,Bi)Sr_2Ca_2Cu_3O_x$. The heat treatment was performed at a temperature of about 900° C. for about 15 minutes, whereby reaction between the two layers was progressed. As the result, a $(Tl,Bi)Sr_2Ca_2Cu_3O_x$ superconducting thin film 4 was formed on the substrate 1, as shown in FIG. 1C.

It was confirmed that the as-obtained thin film exhibited a critical temperature Tci of about 110 K. with an excellent superconducting property. It was also confirmed that this superconducting thin film was a c-axis oriented Tl—Bi—Sr—Ca—Cu—O superconducting thin film from results of X-ray diffraction and SEM/EDX.

Figure 2:
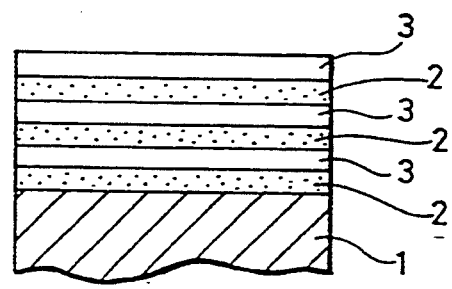
FIG. 2 is a sectional view showing a substance obtained by alternately repeating a step of forming a (Tl, Bi)$Sr_2CaCu_2O_x$ layer and a step of forming an amorphous Ca—Cu—O layer on this film a plurality of times in Example IX according to the present invention.

Although a single $(Tl,Bi)Sr_2CaCu_2O_x$ layer and a single Ca—Cu—O layer were formed in Example IX, numbers of such layers may be alternately formed as shown in FIG. 2 in the present invention.

Example X (Tl—Ba—Ca—Cu—O System)

First, a Tl—Ba—Ca—Cu—O layer was vapor-deposited on an MgO (100) single-crystalline substrate by multi-element vapor deposition. In such vapor deposition, the substrate was set at the room temperature with an oxygen partial pressure of $1 \times 10^{-5}$ Torr, while Tl, Ba, Ca and Cu were employed as vapor deposition raw materials. The rates or times for vapor-depositing the respective raw materials were adjusted to control the composition of the as-formed film to $Tl_2Ba_2CaCu_2O_x$. Then, the substrate was filled in a gold pipe with a Tl source, so that the film was heat treated in Tl vapor. The heat treatment was performed at a temperature of about 800° C. for about 15 minutes, to synthesize a $Tl_2Ba_2CaCu_2O_x$ thin film.

Then, a Ca—Cu—O layer was formed on the $Tl_2Ba_2CaCu_2O_x$ layer. In such film formation, the substrate was maintained at the room temperature with the oxygen partial pressure of $1 \times 10^{-5}$ Torr, while Ca and Cu were employed as vapor deposition raw materials. The composition of the elements totalized in the two films was $Tl_2Ba_2Ca_2Cu_3O_x$.

Then, the substrate was filled in a gold pipe with a Tl source, and a heat treatment was performed in Tl vapor. The Tl source was formed by a sintering material having a composition of $Tl_2Ba_2Ca_2Cu_3O_x$. The heat treatment was performed at about 900° C. for about 15 minutes, so that reaction was progressed between the two films. It was confirmed that the as-obtained thin film exhibited a critical temperature Tci of about 115K, with an excellent superconducting property. It was also confirmed that this superconducting thin film was a c-axis oriented Tl—Ba—Ca—Cu—O superconducting thin film from results of X-ray diffraction and SEM/EDX.

Although a single $TlBa_2CaCu_2O_x$ layer and a single CA—CU—O layer were formed in Example X, numbers of such layers may be alternately formed in the present invention. Example XI (Tl—Pb—Ba—Ca—Cu—O System)

First, a Tl—Pb—Ba—Ca—Cu—O layer was vapor-deposited on an MgO (100) single-crystalline substrate by multi-element vapor deposition. In such vapor deposition, the substrate was set at the room temperature with an oxygen partial pressure of $1 \times 10^{-5}$ Torr, while Tl, Pb, Ba, Ca and Cu were employed as vapor deposition raw materials. The rates or times for vapor-depositing the respective raw materials were adjusted to control the composition of the as-formed film to $(Tl,Pb)Ba_2CaCu_2O_x$. Then, the substrate was filled in a gold pipe with a Tl source, and subjected to a heat treatment in Tl vapor. The Tl source was formed by a sintering material having a composition of $(Tl,Pb)Ba_2CaCu_2O_x$. The heat treatment was performed at about 800° C. for about 15 minutes, to synthesize a $(Tl,Pb)Ba_2CaCu_2O_x$ thin film.

Then, a Ca—Cu—O layer was formed on the $(Tl,Pb)Ba_2CaCu_2O_x$ layer. In such film formation, the substrate was maintained at the room temperature with the oxygen partial pressure of $1 \times 10^{-5}$ Torr, while Ca and Cu were employed as vapor deposition raw materials. The composition of the elements contained in the as-formed two films was $(Tl,Pb)Ba_2Ca_2Cu_3O_x$.

Then, the substrate was filled in a gold pipe with a Tl source, and subjected to a heat treatment in Tl vapor. The heat treatment was performed at about 900° C. for about 15 minutes, to synthesize a superconducting layer having a high critical temperature. The Tl source was formed by a sintering material having a composition of $(Tl,Pb)Ba_2Ca_2Cu_3O_x$. It was confirmed that the as-obtained thin film exhibited a critical temperature Tci of about 110K with an excellent superconducting property. It was also confirmed that this superconducting thin film was a c-axis oriented Tl—P-b—Ba—Ca—Cu—O superconducting thin film from results of X-ray diffraction and SEM/EDX.

Although a single $(Tl,Pb)Ba_2CaCu_2O_x$ layer and a single Ca—Cu—O layer were formed in Example XI, numbers of such layers may be alternately provided in the present invention.

Example XII (Tl—Bi—Sr—Ca—Cu—O System)

Figure 3A:
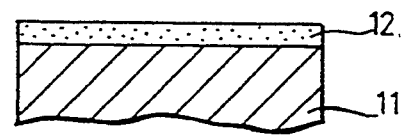
FIGS. 3A, 3B and 3C are sectional views showing steps of preparing a Tl—Bi—Sr—Ca—Cu—O superconducting thin film in Example XII according to the present invention.

First, an Sr—Ca—Cu—O layer was vapor-deposited on an MgO (100) single-crystalline substrate by multi-element vapor deposition. In such vapor deposition, the substrate was set at the room temperature with an oxygen partial pressure of $1 \times 10^{-5}$ Torr, while Sr, Ca and Cu were employed as vapor deposition raw materials. FIG. 3A shows the result of this step. As shown in FIG. 3A, an Sr—Ca—Cu—O layer 12 was formed on a substrate 11.

Figure 3B:
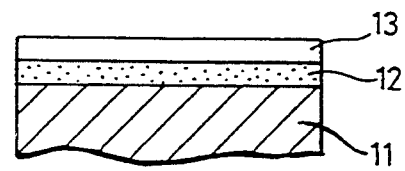

Then, a Tl—Bi—O layer was formed on the Sr—Ca—Cu—O layer. In such film formation, the substrate was maintained at the room temperature with the oxygen partial pressure of $1 \times 10^{-5}$ Torr, while Tl and $Bi_2O_3$ were employed as vapor deposition raw materials. The rates or times for vapor-depositing the respective raw materials were adjusted to form a Tl—Bi—O layer so that the composition of the elements totalized in the two films was $(Tl,Bi)Sr_2Ca_2Cu_3O_x$. FIG. 3B shows the result of this step. As shown in FIG. 3B, a Tl—Bi—O layer 13 was formed on the Sr—Ca—Cu—O layer 12 which was provided on the substrate 11.

Figure 3C:
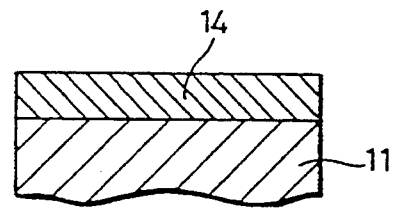
Figure 4:
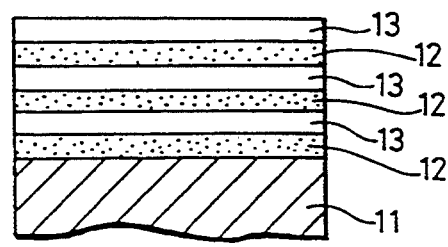
FIG. 4 is a sectional view showing a substance obtained by alternately repeating a step of forming an Sr—Ca—Cu—O layer and a step of forming a Tl—Bi—O layer on this layer a plurality of times in Example XII according to the present invention.

Then, the substrate was filled in a gold pipe with a Tl source, to be subjected to a heat treatment in Ti vapor. The Tl source was formed by a sintering material having a composition of $(Tl,Bi)Sr_2Ca_2Cu_3O_x$. The heat treatment was performed at about 900° C. for about 15 minutes, whereby reaction was progressed between the two films. As the result, a Tl—Bi—Sr—Ca—Cu—O superconducting thin film 14 having a high critical temperature was formed on the substrate 11, as shown in FIG. 3C.

It was confirmed that the as-obtained thin film exhibited a critical temperature Tci of about 110K with an excellent superconducting property. It was also confirmed that this superconducting thin film was a Tl—Bi—Sr—Ca—Cu—O superconducting thin film from results of X-ray diffraction and SEM/EDX.

Although a single Sr—Ca—Cu—O layer and a single Tl—Bi—O layer were formed in Example XII, numbers of such layers may be alternately formed as shown in FIG.

Example XIII (Tl—Ba—Ca—Cu—O System)

First, a Ba—Ca—Cu—O layer was formed on an MgO (100) single-crystalline substrate by multi-element vapor deposition. In such vapor deposition, the substrate was set at the room temperature with an oxygen partial pressure of about $1 \times 10^{-5}$ Torr, while Ba, Ca and Cu were employed as vapor deposition raw materials.

Then, a Tl—O layer was formed on the Ba—Ca—Cu—O layer. In such film formation, the substrate was maintained at the room temperature with the oxygen partial pressure of about $1 \times 10^{-5}$ Torr, while Tl was employed as a vapor deposition raw material. The rate or time for vapor-depositing the raw material was adjusted to form a Tl—O layer so that the composition of the elements contained in the two films was $Tl_2Ba_2Ca_2Cu_3O_x$.

Then the substrate was filled in a gold pipe with a Tl source, and subjected to a heat treatment in Tl vapor. The Tl source was formed by a sintering material having a composition of $Tl_2Ba_2Ca_2Cu_3O_x$. The heat treatment was performed at about 900° C. for about 15 minutes so that reaction was progressed between the two films, to form a superconducting layer having a high critical temperature.

It was confirmed that the as-obtained thin film exhibited a critical temperature Tci of about 115K with an excellent superconducting property. It was also confirmed that this superconducting thin film was a Tl—Ba—Ca—Cu—O superconducting thin film from results of x-ray diffraction and SEM/EDX.

Although a single Ba—Ca—Cu—O layer and a single Tl—O layer were formed in Example XIII, numbers such layers may be alternately provided in the present invention.

Example XIV (Tl—Pb—Ba—Ca—Cu—O System)

First, a Ba—Ca—Cu—O layer was formed on an MgO (100) single-crystalline substrate by multi-element vapor deposition. In such vapor deposition, the substrate was set at the room temperature with an oxygen partial pressure of about $1 \times 10^{-5}$ Torr, while Ba, Ca and Cu were employed as vapor deposition raw materials.

Then, a Tl—Pb—O layer was formed on the Ba—Ca—Cu—O layer. In such film formation, the substrate was maintained at the room temperature with the oxygen partial pressure of about $1 \times 10^{-5}$ Torr, while Tl and Pb were employed as vapor deposition raw materials. The rates or times for vapor-depositing the respective raw materials were adjusted to form the Tl—Pb—O layer were formed in Example XIV, numments contained in the two films was $(Tl,Pb)Ba_2Ca_2Cu_3O_x$.

Then the substrate was filled in a gold pipe with a Tl source, and subjected to a heat treatment in Tl vapor. The Tl source was formed by a sintering material having a composition of $(Tl,Pb)Ba_2Ca_2Cu_3O_x$. The heat treatment was performed at about 900° C. for about 15 minutes to progress reaction between the two films, thereby forming a superconducting thin film having a high critical temperature.

It was confirmed that the as-obtained thin film exhibited a critical temperature Tci of about 110K with an excellent superconducting property. It was also confirmed that this superconducting thin film was a Tl—Pb—Sr—Ca—Cu—O superconducting thin film from results of X-ray diffraction and SE/EDX.

Although a single Ba—Ca—Cu—O layer and a single Tl—Pb—0 layer were formed in Example XIV, numbers such layers may be alternately formed in the present invention.

Comparative Example I (Tl—Bi—Sr—Ca—Cu—O System)

First, a Tl—Bi—Sr—Ca—Cu—O layer was formed on an MgO (100) single-crystalline substrate by multi-element vapor deposition. In such vapor deposition, the substrate was set at the room temperature with an oxygen partial pressure of about $1 \times 10^{-5}$ Torr, while Tl, $Bi_2O_3$, St, Ca and Cu were employed as vapor deposition raw materials. The rates or times for vapor-depositing the respective raw materials were adjusted to form a film having a composition of $(Tl,Bi)Sr_2Ca_2Cu_3O_x$.

Then, the substrate was filled in a gold pipe with a Tl source, and subjected to a heat treatment in Tl vapor. The Tl source was formed by a sintering material having a composition of $(Tl,Bi)Sr_2Ca_2Cu_3O_x$. The heat treatment was performed at about 900° C. for about 15 minutes.

The as-obtained thin film exhibited a critical temperature Tci of about 80K. It was confirmed that this superconducting thin film was a Tl—Bi—Sr—Ca—Cu—O superconducting thin film from results of X-ray diffraction and SEM/EDX.

Comparative Example II (Tl—Ba—Ca—Cu—O System)

Tl, Ba, Ca and Cu were employed as vapor deposition raw materials to form a thin film in a similar manner to Comparative Example I. The as-obtained thin film exhibited a critical temperature Tci of about 80K. It was confirmed that this superconducting thin film was a Tl—Ba—Ca—Cu—O superconducting thin film from results of X-ray diffraction and SEM/EDX.

Comparative Example III (Tl—Pb—Ba—Ca—Cu—O System)

Tl, Pb, Ba, Ca and Cu were employed as vapor deposition raw materials, to form a thin film in a similar manner to Comparative Example I. The as-obtained thin film exhibited a critical temperature Tci of about 80K. It was confirmed that this superconducting thin film was a Tl—Pb—Ba—Ca—Cu—O superconducting thin film from results of X-ray diffraction and SEM/EDX.

As clearly understood from the above description, it was confirmed that all superconducting thin films prepared in Examples IX to XIV according to the present invention exhibited high critical temperatures with excellent superconducting properties.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of preparing an oxide superconducting thin film having a critical temperature of at least about 100K. from a thin film containing elements capable of forming a Tl oxide superconductor, said method comprising:

forming an amorphous film having a composition of $Tl_aBi_bSr_cCa_dCu_3$ oxide, wherein $0.7 \leq a \leq 3.0$, $0.2 \leq b \leq 1.0$, $1.6 \leq c \leq 2.4$, and $1.6 \leq d \leq 2.4$, on a substrate in a thickness of at least about 0.2 μm and not more that about 1.8 μm; and heat treating said amorphous thin film with a Tl vapor source at a temperature of about 850° to 940° C. for about 5 minutes to about 8 hours to form a Tl—Bi—Sr—Ca—Cu—O oxide superconductor film.

2. A method of preparing an oxide superconducting thin film having a critical temperature of at least about 100K. from at least two thin films containing elements capable of forming a Tl oxide superconductor, said method comprising:

a step of forming a first layer of a Tl oxide superconductor having a first critical temperature on a substrate;

a step of forming an amorphous second layer consisting essentially of Ca, Cu and O on said first layer; and a step of heat treating said first and second layers with a Tl vapor source for reacting said first layer with said second layer, thereby forming a thin film of a Tl oxide superconductor having a second critical temperature being higher than said first critical temperature.

3. A method of preparing an oxide superconducting thin film in accordance with claim 2, wherein atomic ratios of said elements in the total quantity of those forming said first and second layers are substantially equal to atomic ratios in said Tl oxide superconductor having said second critical temperature, said second critical temperature being at least about 110K.

4. A method of preparing an oxide superconducting thin film in accordance with claim 2, wherein said Tl oxide superconductor having said first critical temperature consists essentially of $(Tl,Bi)Sr_2CaCu_2$ oxide, $(Tl,Bi)Sr_2Ca_2Cu_3$ oxide being formed as said Tl oxide superconductor having said second critical temperature.

5. A method of preparing an oxide superconducting thin film in accordance with claim 2, wherein said Tl oxide superconductor having said first critical temperature consists essentially of $Tl_2Ba_2CaCu_2$ oxide, $Tl_2Ba_2Ca_2Cu_3$ oxide being formed as said Tl oxide superconductor having said second critical temperature.

6. A method of preparing an oxide superconducting thin film in accordance with claim 2, wherein said Tl oxide superconductor having said first critical temperature consists essentially of $(Tl,Pb)Ba_2CaCu_2$ oxide, $(Tl,Pb)Ba_2Ca_2Cu_3$ oxide being formed as said Tl oxide superconductor having said second critical temperature.

7. A method of forming an oxide superconducting thin film having a critical temperature of at least about 100K. from at least two thin films containing elements capable of forming a Tl oxide superconductor, said method comprising:

forming a first layer consisting essentially of element combinations selected from the group consisting of Sr/Ca/Cu/O and Ba/Ca/Cu/O;

forming a second layer consisting essentially of element combinations selected from the group consisting of Tl/Bi/O, Tl/O, and Tl/Pb/O; and heat treating said first and second layers with Tl vapor source for reacting said first layer with said second layer, thereby forming a thin film of a Tl oxide superconductor having a critical temperature of at least about 100K.

8. A method of preparing an oxide superconducting thin film in accordance with claim 7, wherein atomic ratios of said elements in the total quantity of those forming said first and second layers are substantially equal to atomic ratios in said Tl oxide superconductor being formed by said reaction, said Tl oxide superconductor being formed by said reaction having a critical temperature of at least about 110K.

9. A method of preparing an oxide superconducting thin film in accordance with claim 7, wherein said first layer consists essentially of Sr, Ca, Cu, and O, and said second layer consists essentially of Tl, Bi and O, a Tl—Bi—Sr—Ca—Cu—O oxide superconductor being formed by said reaction.

10. A method of preparing an oxide superconducting thin film in accordance with claim 7, wherein said first layer consists essentially of Ba, Ca, Cu, and O, and said second layer consists essentially of Tl and O, a Tl—Ba—Ca—Cu—O oxide superconductor being formed by said reaction.

11. A method of preparing an oxide superconducting thin film in accordance with claim 7, wherein said first layer consists essentially of Ba, Ca, Cu, and O, and said second layer consists essentially of Tl, Pb and O, a Tl—Pb—Ba—Ca—Cu—O oxide superconductor being formed by said reaction.

* * * * *